United States Patent
Yun et al.

(10) Patent No.: US 9,136,432 B2
(45) Date of Patent: Sep. 15, 2015

(54) HIGH EFFICIENCY LIGHT EMITTING DIODE

(75) Inventors: Jun Ho Yun, Ansan-si (KR); Ki Bum Nam, Ansan-si (KR); Joon Hee Lee, Ansan-si (KR); Chang Youn Kim, Ansan-si (KR); Hong Jae Yoo, Ansan-si (KR); Sung Hoon Hong, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 253 days.

(21) Appl. No.: 13/997,873

(22) PCT Filed: Dec. 6, 2011

(86) PCT No.: PCT/KR2011/009389
§ 371 (c)(1),
(2), (4) Date: Jun. 25, 2013

(87) PCT Pub. No.: WO2012/091311
PCT Pub. Date: Jul. 5, 2012

(65) Prior Publication Data
US 2013/0292645 A1    Nov. 7, 2013

(30) Foreign Application Priority Data

Dec. 28, 2010   (KR) .................. 10-2010-0136879
Jan. 7, 2011    (KR) .................. 10-2011-0001633

(51) Int. Cl.
| | |
|---|---|
| *H01L 33/14* | (2010.01) |
| *H01L 33/38* | (2010.01) |
| *H01L 33/40* | (2010.01) |
| *H01L 33/00* | (2010.01) |
| *H01L 33/22* | (2010.01) |
| *H01L 33/44* | (2010.01) |

(52) U.S. Cl.
CPC ............... *H01L 33/14* (2013.01); *H01L 33/38* (2013.01); *H01L 33/405* (2013.01); *H01L 33/0079* (2013.01); *H01L 33/22* (2013.01); *H01L 33/44* (2013.01)

(58) Field of Classification Search
CPC ......... H01L 33/02; H01L 33/00; H01L 33/14; H01L 33/36; H01L 33/38; H01L 33/387; H01L 33/40; H01L 33/405; H01L 33/0079; H01L 33/0062; H01L 33/0066; H01L 33/007; H01L 33/0075; H01L 33/20; H01L 33/22; H01L 33/44; H01L 33/46; H01L 33/465; H01L 33/48; H01L 33/58; H01L 33/60
See application file for complete search history.

(56) References Cited

U.S. PATENT DOCUMENTS

2003/0141506 A1*   7/2003   Sano et al. .................. 257/78
2005/0017252 A1*   1/2005   Streubel et al. ............. 257/79

(Continued)

FOREIGN PATENT DOCUMENTS

| KR | 10-2004-0073434 | 8/2004 |
| KR | 10-2006-0035424 | 4/2006 |
| KR | 10-2010-0093977 | 8/2010 |

OTHER PUBLICATIONS

International Search Report issued on Jul. 31, 2012 in PCT/KR2011/009389.

*Primary Examiner* — Anthony Ho
*Assistant Examiner* — Samuel Lair
(74) *Attorney, Agent, or Firm* — H.C. Park Associates, PLC

(57) ABSTRACT

Disclosed herein is a high efficiency light emitting diode. The light emitting diode includes: a semiconductor stack positioned over a support substrate; a reflective metal layer positioned between the support substrate and the semiconductor stack to ohmic-contact a p-type compound semiconductor layer of the semiconductor stack and having a groove exposing the semiconductor stack; a first electrode pad positioned on an n-type compound semiconductor layer of the semiconductor stack; an electrode extension extending from the first electrode pad and positioned over the groove region; and an upper insulating layer interposed between the first electrode pad and the semiconductor stack. In addition, the n-type compound semiconductor layer includes an n-type contact layer, and the n-type contact layer has a Si doping concentration of 5 to $7 \times 10^{18}/cm^3$ and a thickness in the range of 5 to 10 um.

21 Claims, 11 Drawing Sheets

(56) References Cited

U.S. PATENT DOCUMENTS

| | | |
|---|---|---|
| 2006/0145165 A1 | 7/2006 | Ishibashi et al. |
| 2007/0138540 A1* | 6/2007 | Uemura et al. ............... 257/324 |
| 2007/0181895 A1* | 8/2007 | Nagai ............................ 257/98 |
| 2007/0194327 A1* | 8/2007 | Ueda et al. ..................... 257/79 |
| 2008/0006836 A1 | 1/2008 | Lee |
| 2009/0184337 A1 | 7/2009 | Fan et al. |
| 2010/0207128 A1 | 8/2010 | Jeong |
| 2012/0025237 A1* | 2/2012 | Lai ................................. 257/98 |
| 2012/0119243 A1* | 5/2012 | Kim et al. ...................... 257/98 |
| 2014/0367722 A1* | 12/2014 | Im et al. ......................... 257/98 |

* cited by examiner (a)

(b)

(c)

(d)

(a)

(b)

(c)

(a) (b)

HIGH EFFICIENCY LIGHT EMITTING DIODE

CROSS-REFERENCE TO RELATED APPLICATIONS

This application is the National Stage entry of International Application PCT/KR2011/009389, filed on Dec. 6, 2011, and claims priority from and the benefit of Korean Patent Application No. 10-2010-0136879, filed on Dec. 28, 2010, and Korean Patent Application No. 10-2011-0001633, filed on Jan. 7, 2011, which are incorporated herein by reference for all purposes as if fully set forth herein.

BACKGROUND OF THE INVENTION

1. Field

The present invention relates to a light emitting diode, and more particularly, to a gallium nitride based high efficiency light emitting diode in which a growth substrate has been removed by applying a substrate separation process.

2. Discussion of the Background

Since group III nitride such as a gallium nitride (GaN), an aluminum nitride (AlN), or the like, generally has excellent thermal stability and a direct transition type energy band structure, it has recently become prominent as a material for a light emitting element in visible ray and ultraviolet regions. Particularly, blue and green light emitting elements using indium gallium nitride (InGaN) have been utilized in various applications such as a large scale natural color flat panel display, a traffic light, indoor illumination, a high density light source, a high resolution output system, optical communication, and the like.

It is difficult to manufacture a homogenous substrate capable of growing a semiconductor layer of the group III nitride. Therefore, the semiconductor layer of the group III nitride is grown on a heterogeneous substrate having a similar crystal structure by a process such as a metal organic chemical vapor deposition (MOCVD) process, a molecular beam epitaxy (MBE) process, or the like. As the heterogeneous substrate, a sapphire substrate having a hexagonal structure is mainly used. However, sapphire is an electrical non-conductor, such that it limits a structure of a light emitting diode. Therefore, a technology of manufacturing a high efficiency light emitting diode having a vertical structure by growing epitaxial layers such as a nitride semiconductor layer on the heterogeneous substrate such as sapphire, bonding the epitaxial layers to a support substrate, and then separating the heterogeneous substrate using a laser lift-off technology, or the like, has been recently developed.

Generally, the vertical type light emitting diode has a structure in which a p side is positioned at a lower portion, such that current spreading performance is excellent as compared to a conventional lateral type light emitting diode. In addition, the vertical type light emitting diode uses a support substrate having thermal conductivity higher than that of sapphire, such that heat dissipating performance is excellent. Furthermore, a roughened surface is formed by anisotropically etching an N-surface by photo enhanced chemical (PEC) etching, or the like, thereby making it possible to significantly improve upward light extraction efficiency.

However, since the entire thickness (about 4 um) of the epitaxial layer is significantly thin as compared to a light emitting area of 350 um×350 um, or 1 $mm^2$, there are many difficulties in current spreading. In order to solve this problem, a technology of promoting current spreading in an n-type layer by using an electrode extension extending from an n-type electrode pad or preventing current from directly flowing from a n-type electrode pad to a p-type electrode by disposing an insulating material at a position of the p-type electrode corresponding to that of the n-type electrode pad has been adopted. However, there is a limitation in preventing current flow from being concentrated from the n-type electrode pad thereunder. Furthermore, there is a limitation in uniformly spreading current over the entire wide light emitting region.

SUMMARY

An object of the present invention is to provide a high efficiency light emitting diode having improved current spreading performance.

Another object of the present invention is to provide a high efficiency light emitting diode having improved light extraction efficiency.

According to exemplary embodiments of the present invention, a high efficiency light emitting diode is provided. The light emitting diode according to the exemplary embodiments of the present invention includes: a support substrate; a semiconductor stack positioned over the support substrate and including a p-type compound semiconductor layer, an active layer, and an n-type compound semiconductor layer; a reflective metal layer positioned between the support substrate and the semiconductor stack to ohmic-contact the p-type compound semiconductor layer of the semiconductor stack and having a groove exposing the semiconductor stack; a first electrode pad positioned on the n-type compound semiconductor layer of the semiconductor stack; an electrode extension extending from the first electrode pad and positioned over the groove region; and an upper insulating layer interposed between the first electrode pad and the semiconductor stack.

In some exemplary embodiments, the n-type compound semiconductor layer includes an n-type contact layer, and the n-type contact layer has a Si doping concentration of 5 to $7 \times 10^{18}/cm^3$ and a thickness in the range of 5 to 10 um.

In other exemplary embodiments, the n-type compound semiconductor layer includes an n-type contact layer and a first recovering layer positioned between the n-type contact layer and the active layer to contact the n-type contact layer. Here, the first recovering layer is an undoped layer or a lowly doped layer having a doping concentration lower than that of the n-type contact layer, and the n-type contact layer has a thickness in the range of 4.5 to 10 um.

The upper insulating layer is disposed between the first electrode pad and the semiconductor stack, thereby making it possible to prevent current from concentratedly flowing from the first electrode pad directly to the semiconductor stack, and the electrode extension is positioned on the upper portion of the groove region, thereby making it possible to prevent current from concentratedly flowing from the electrode extension in a vertical direction.

Furthermore, the n-type contact layer has the doping concentration of 5 to $7 \times 10^{18}/cm^3$ and the relatively thick thickness, thereby making it possible to improve current spreading in the n-type contact layer and improve reliability accordingly. The relatively thicker the thickness of the n-type contact layer, the more advantageous the current spreading. However, since crystallinity of an epitaxial layer is deteriorated as the thickness of the n-type contact layer increases, it is preferable that the n-type contact layer has a thickness of 10 um or less.

Meanwhile, the n-type compound semiconductor layer may further include a superlattice layer interposed between the n-type contact layer and the active layer. The superlattice layer may have a structure in which InGaN layers and GaN layers are alternately stacked. Furthermore, the superlattice layer may have resistivity larger than that of the n-type contact layer. The superlattice layer alleviates strain between the n-type contact layer and the active layer, thereby improving crystallinity of the active layer.

The first recovering layer, which is a layer grown on the n-type contact layer after the n-type contact layer is grown, is formed in order to recover crystallinity deteriorated because a relatively highly doped n-type contact layer is formed to have a thick thickness. Furthermore, since the first recovering layer is formed as a relatively high resistivity layer, the first recovering layer helps current spreading in the n-type contact layer. Since the first recovering layer is the relatively high resistivity layer, the first recovering layer needs to be formed to have a relatively thin thickness. However, it is preferable that the first recovering layer is formed to have a thickness at which tunneling is not generated in order to help the current spreading in the n-type contact layer. For example, the first recovering layer may have a thickness in the range of 100 to 200 nm.

Furthermore, the light emitting diode may further include an electron injection layer interposed between the first recovering layer and the active layer. In addition, the light emitting diode may further include a second recovering layer interposed between the first recovering layer and an electron supplementation layer; and the electron supplementation layer interposed between the first and second recovering layers.

The electron injection layer, which is a layer doped with relatively high concentration n-type impurities, may be a doped layer having a concentration equal to or higher than that of the n-type contact layer. Meanwhile, the electron supplementation layer supplements electrons between the first and second recovering layers, thereby alleviating an increase in forward voltage due to the recovering layers. The electron supplementation layer may be doped, for example, at a doping concentration equal to or lower than that of the electron injection layer, and at a doping concentration higher than that of the recovering layer.

Meanwhile, the superlattice layer may be interposed between the electron injection layer and the active layer.

Meanwhile, the light emitting diode may further include an intermediate insulating layer contacting a surface of the semiconductor stack exposed in the groove of the reflective metal layer. Therefore, the intermediate insulating layer is positioned under the electrode extension, thereby preventing the current from being concentrated from the electrode extension in the vertical direction.

In some exemplary embodiments, the reflective metal layer may be formed of a plurality of plates. The intermediate insulating layer may cover edges of the plurality of plates as well as sides thereof.

In addition, a barrier metal layer may be positioned between the reflective metal layer and the support substrate to cover the reflective metal layer. The barrier metal layer prevents migration of metal atoms of the reflective metal layer, thereby protecting the reflective metal layer.

Meanwhile, the light emitting diode may include a plurality of first electrode pads; and a plurality of electrode extensions each extended from the plurality of first electrode pads. The plurality of electrode extensions may be positioned over regions between the plurality of plates.

In addition, the semiconductor stack may have a roughened surface, and the upper insulating layer may cover the roughened surface. Here, the upper insulating layer may have a concave-convex surface formed along the roughened surface.

The upper insulating layer has the concave-convex surface, thereby making it possible to reduce the total internal reflection generated on an upper surface of the upper insulating layer. Therefore, it is possible to further improve light extraction efficiency.

Meanwhile, the semiconductor stack may have a flat surface and the first electrode pad and the electrode extension may be positioned on the flat surface. Furthermore, the electrode extension may contact the flat surface of the semiconductor stack. In addition, the roughened surface may be positioned at a position lower than that of the electrode extension.

The support substrate may be a conductive substrate. The support substrate may be, for example, a metal substrate or a semiconductor substrate. Alternatively, the support substrate may be an insulating substrate, and a second electrode pad may be formed on the barrier metal layer.

According to the exemplary embodiment of the present invention, the upper insulating layer is disposed between the first electrode pad and the semiconductor stack, thereby making it possible to prevent current from concentratedly flowing from the first electrode pad directly to the semiconductor stack, and the electrode extension is positioned over the groove region, thereby making it possible to prevent current from concentratedly flowing from the electrode extension in a vertical direction. Further, a doping concentration and a thickness of the n-type contact layer are controlled, thereby making it possible to improve current spreading in the n-type contact layer and improve reliability accordingly. In addition, the electrode extension is positioned over the groove region and the n-type contact layer positioned on the first recovering layer having relatively high resistivity is formed to have a relatively thick thickness, thereby making it possible to improve current spreading in the n-type contact layer and improve reliability accordingly.

BRIEF DESCRIPTION OF THE DRAWINGS

The above and other objects, features and advantages of the present invention will become apparent from the following description of preferred embodiments given in conjunction with the accompanying drawings, in which:

FIGS. 4 to 8 are, respectively, cross-sectional views describing a method of manufacturing a light emitting diode according to an exemplary embodiment of the present invention and taken along the line A-A of FIG. 1, wherein

DETAILED DESCRIPTION OF THE ILLUSTRATED EMBODIMENTS

Figure 1:
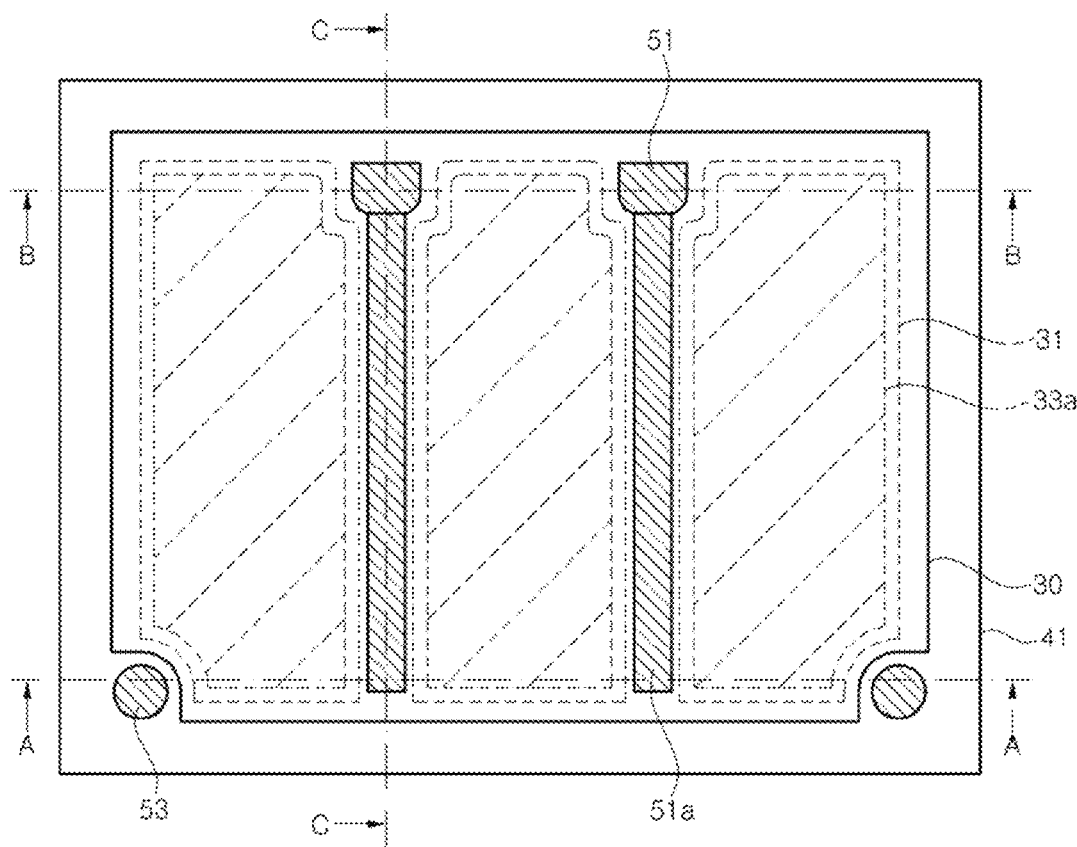
FIG. 1 is a schematic layout diagram describing a light emitting diode according to an exemplary embodiment of the present invention.

Hereinafter, exemplary embodiments of the present invention will be described in detail with reference to the accompanying drawings. The exemplary embodiments of the present invention to be described below are provided by way of example so that the idea of the present invention can be sufficiently transferred to those skilled in the art to which the present invention pertains. Therefore, the present invention is not limited to the exemplary embodiments set forth herein but may be modified in many different forms. In the accompanying drawings, like reference numerals are used to describe like components and widths, lengths, thicknesses, or the like, of components may be exaggerated for convenience.

Figure 2A:
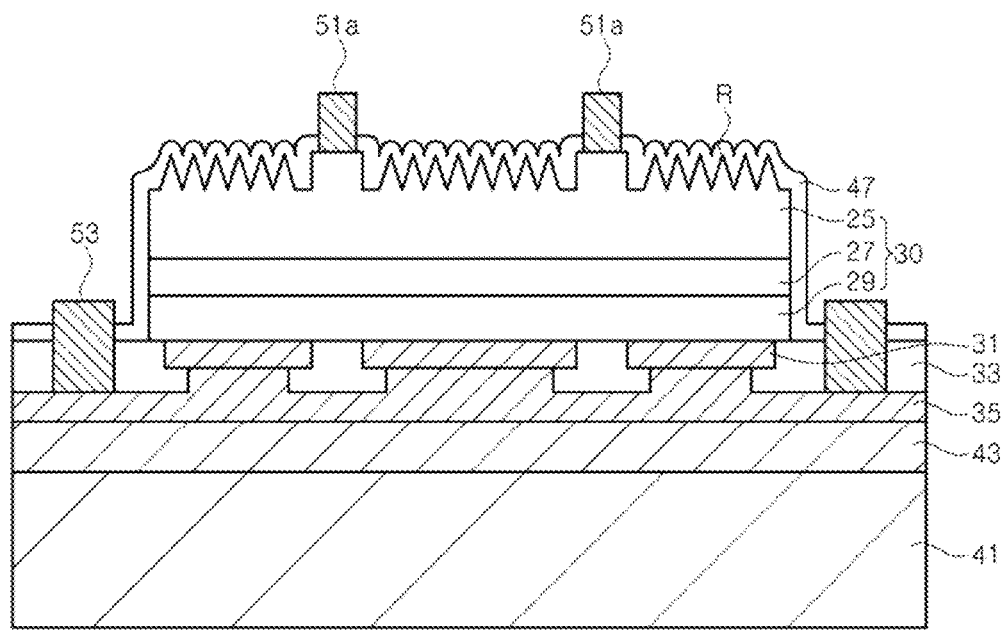
FIGS. 2A, 2B and 2C are, respectively, cross-sectional views taken along the line A-A, the line B-B, and the line C-C of FIG. 1 in order to describe the light emitting diode according to the exemplary embodiment of the present invention.
Figure 2B:
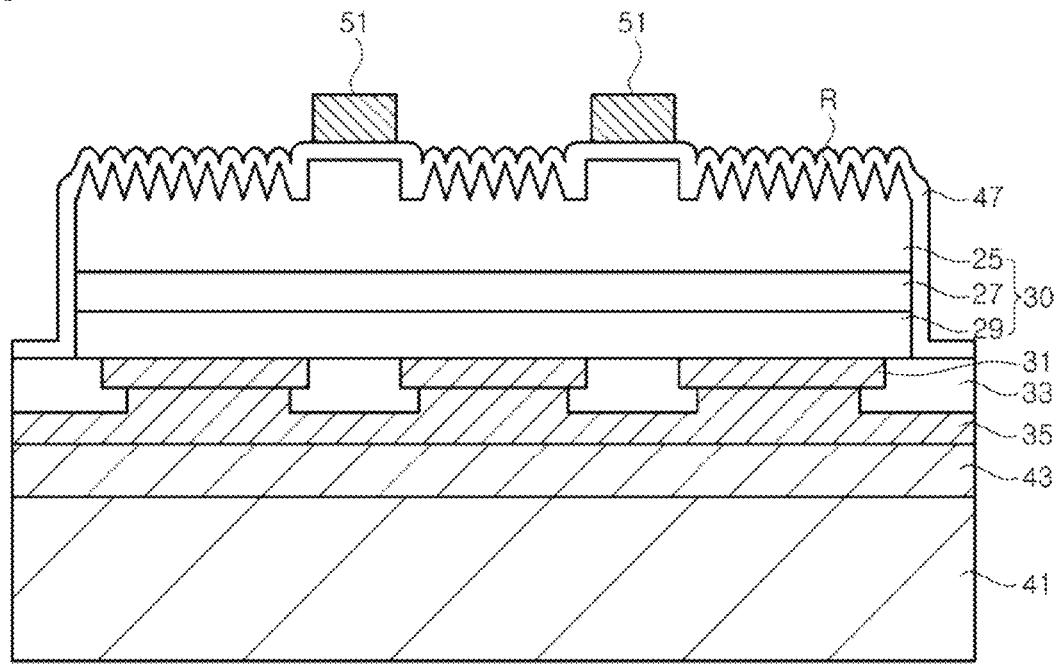
Figure 2C:
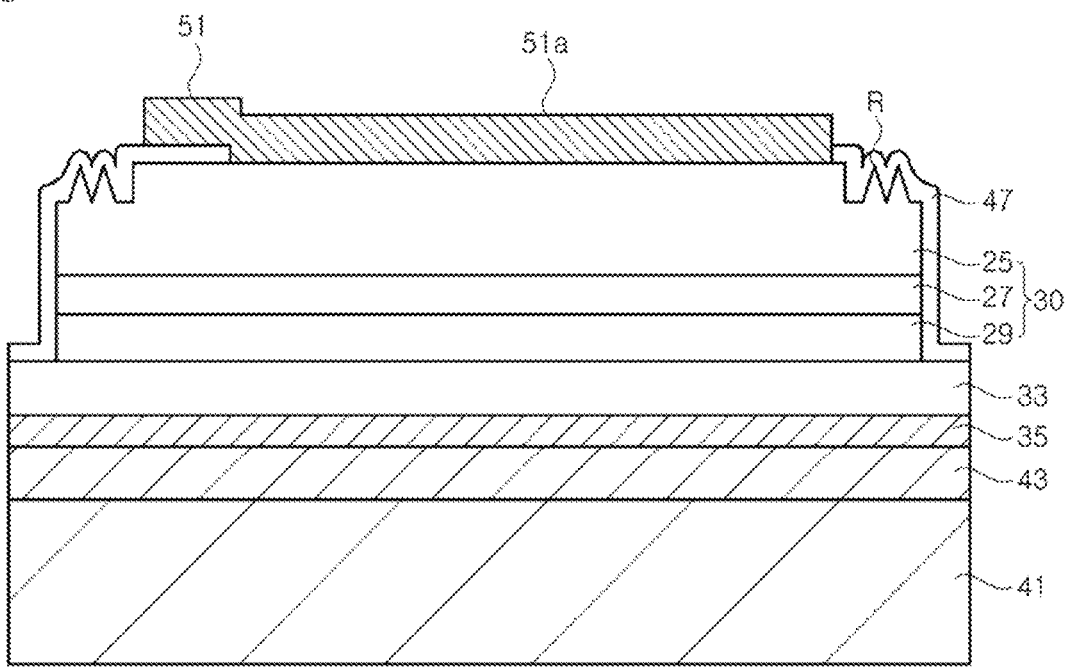
Figure 3:
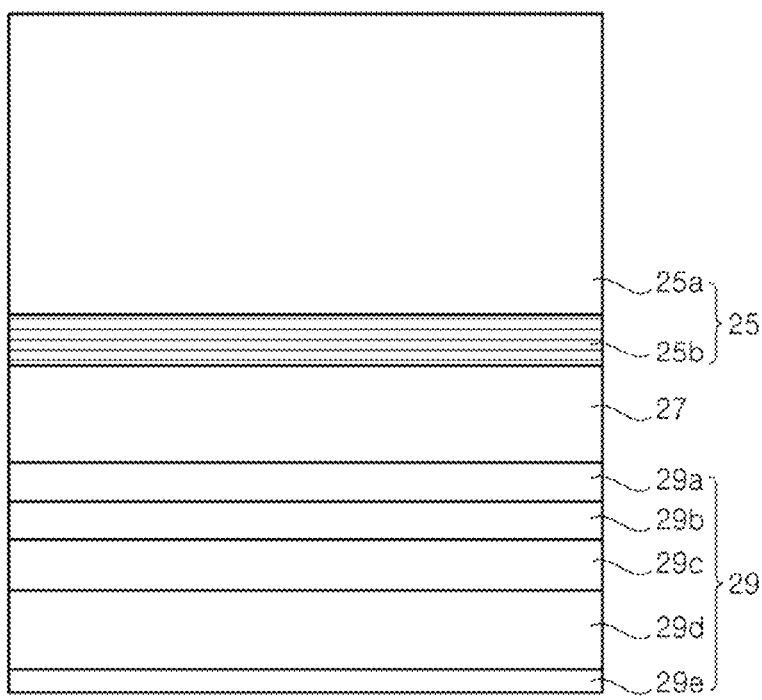
FIG. 3 is an enlarged cross-sectional view describing a semiconductor stack of the light emitting diode according to the exemplary embodiment of the present invention.

FIG. 1 is a schematic layout diagram describing a light emitting diode according to an exemplary embodiment of the present invention; and FIGS. 2A to 2C are, respectively, cross-sectional views taken along the line A-A, the line B-B, and the line C-C of FIG. 1 in order to describe the light emitting diode according to the exemplary embodiment of the present invention. In addition, FIG. 3 is an enlarged cross-sectional view describing a semiconductor stack of the light emitting diode. In FIG. 1, a reflective metal layer 31 and an intermediate insulating layer 33 positioned under a semiconductor stack 30 are represented by a dotted line.

Referring to FIGS. 1 to 3, the light emitting diode is configured to include a support substrate 41, a semiconductor stack 30, the reflective metal layer 31, the intermediate insulating layer 33, a barrier metal layer 35, an upper insulating layer 47, an n-electrode pad 51, a p-electrode pad 53, and an electrode extension 51a. In addition, the light emitting diode may include a bonding metal 43.

The support substrate 41 is different from a growth substrate for growing compound semiconductor layers and is a secondary substrate attached to previously grown compound semiconductor layers. The support substrate 41 may be a conductive substrate, for example, a metal substrate or a semiconductor substrate but is not limited thereto. That is, the support substrate may also be an insulation substrate such as sapphire substrate. When the support substrate 41 is the conductive substrate, the p-electrode pad 53 may be positioned under the support substrate 41 or be omitted.

The semiconductor stack 30 is positioned on the support substrate 41 and includes a p-type compound semiconductor layer 29, an active layer 27, and an n-type compound semiconductor layer 25. Here, in the semiconductor stack 30, the p-type compound semiconductor layer 29 is positioned closely to the support substrate 41 as compared to the n-type compound semiconductor layer 25, similar to a general vertical type light emitting diode. The semiconductor stack 30 may be positioned on a partial region of the support substrate 41. That is, the support substrate 41 has a relatively wider area as compared to the semiconductor stack 30 and is positioned in a region enclosed by an edge of the support substrate 41.

Each of the n-type compound semiconductor layer 25, the active layer 27, and the p-type compound semiconductor layer 29 may be made of a III-N based compound semiconductor, for example, a (Al, Ga, In)N semiconductor. Each of the n-type compound semiconductor layer 25 and the p-type compound semiconductor layer 29 may be formed of multiple layers as shown in FIG. 3.

That is, as shown in FIG. 3, the n-type compound semiconductor layer 25 may include an n-type contact layer 25a and a superlattice layer 25b. The n-type contact layer 25a, which is an n-type semiconductor layer into which current is inject from the outside, has a relatively high doping concentration, for example, a doping concentration of 5 to $7\times10^{18}$/cm$^3$. The n-type contact layer 25a may have a roughened surface, and the entire thickness of the n-type contact layer 25a including the roughened surface is in the range of 5 to 10 um. When the n-type contact layer 25a has a thin thickness, it is difficult to achieve current spreading. In addition, when the n-type contact layer 25a has a thickness of 10 um or more, crystallinity of the n-type contact layer is deteriorated and forward voltage of the light emitting diode is increased.

The superlattice layer 25b may be formed in order to alleviate strain caused by a relatively thick n-type contact layer 25a. The superlattice layer 25b may be formed by alternately stacking (In)GaN layers having different compositions. For example, the super lattice layer 25b may be formed by alternately stacking InGaN layers and GaN layers and the GaN layers may be doped with Si. The supperlattice layer 25b may have resistivity relatively higher than that of the n-type contact layer 25a.

Meanwhile, the active layer 27 may have a single quantum well structure or a multiple quantum well structure. For example, the active layer 27 may have a multiple quantum well structure in which barrier layers and well layers are alternately stacked, wherein the barrier layers may be made of GaN or InGaN and the well layers may be made of InGaN.

Meanwhile, the p-type compound semiconductor layer 29 may include an electron blocking layer 29a, a hole injection layer 29b, an undoped layer or low concentration doped layer 29c, a p-type contact layer 29d, and a highly doped layer 29e. The p-type contact layer 29d is a semiconductor layer into which the current is injected from the outside and may ohmic-contact the reflective metal layer 31. Meanwhile, when it is difficult to allow the reflective metal layer 31 directly to ohmic-contact the p-type contact layer 29d, the highly doped layer 29e may be added in order to ohmic-contact therebetween. The highly doped layer 29e may be doped with p-type impurities at a higher concentration as compared to the p-type contact layer 29d but is not limited thereto. That is, the highly doped layer 29e may be doped with n-type impurities at a high concentration.

Meanwhile, the electron blocking layer 29a serves to confine electrons in the active layer 27, and the hole injection layer 29b is formed as a highly doped layer in order to inject holes into the active layer 27. Meanwhile, the undoped layer or the lowly doped layer 29c is formed in order to recover crystallinity deteriorated due to high concentration doping of the hole injection layer 29b and impedes movement of the holes to help current spreading in the p-type contact layer 29d.

Again referring to FIGS. 2A to 2C, the n-type compound semiconductor layer 25 having relatively low resistance is positioned at an opposite side to the support substrate 41, such that a roughened surface R may be easily formed on an upper surface of the n-type compound semiconductor layer 25, wherein the roughened surface R improves extraction efficiency of light generated in the active layer 27.

Meanwhile, p-electrodes 31 and 35 may be positioned between the p-type compound semiconductor layer 29 and the support substrate 41 and include the reflective metal layer 31 and the barrier metal layer 35. The reflective metal layer 31 is positioned between the semiconductor stack 30 and the support substrate 41 and ohmic-contacts the p-type compound semiconductor layer 29, that is, the p-type contact layer 29d or the highly doped layer 29e. The reflective metal layer 31 may include a reflective layer such as Ag. The reflective metal layer 31 is restrictively positioned under the semiconductor stack 30. The reflective metal layer 31 may be formed of a plurality of plates as shown in FIG. 1, wherein the plurality of plates include grooves formed therebetween. The semiconductor stack 30 is exposed through the grooves.

The intermediate insulating layer 33 is positioned between the reflective metal layer 31 and the support substrate 41 and covers the reflective metal layer 31. The intermediate insulating layer 33 may cover the reflective metal layer 31, for example, edges of the plurality of plates as well as sides thereof. The intermediate insulating layer 33 contacts a surface of the semiconductor stack 30 exposed by the grooves of the reflective metal layer 31 to prevent current from flowing in the groove region. The intermediate insulating layer 33 may be formed of a single layer or multiple layers of a silicon oxide film or a silicon nitride film and be a distributed Bragg reflector in which insulating layers having different reflective indices, for example, $SiO_2/TiO_2$ or $SiO_2/Nb_2O_5$ are repeatedly stacked. A phenomenon that a side of the reflective metal layer 31 is exposed to the outside may be prevented by the intermediate insulating layer 33. The intermediate insulating layer 33 may also be positioned under the side of the semiconductor stack 30. Therefore, the intermediate insulating layer 33 may prevent leakage of current through the side of the semiconductor stack 30.

The barrier metal layer 35 is positioned between the reflective metal layer 31 and the support substrate 41 to cover the reflective metal layer 31. The barrier metal layer 35 prevents migration of metallic material, for example, Ag, of the reflective metal layer 31 to protect the reflective metal layer 31. The barrier metal layer 35 may include, for example, a Ni layer. The barrier metal layer 35 may also cover the intermediate insulating layer 33 under the intermediate insulating layer 33 and be positioned over the entire surface of the support substrate 41.

Meanwhile, the support substrate 41 may be bonded onto the barrier metal layer 35 through the bonding metal 43. The bonding metal 43 may be formed by, for example, eutectic bonding of Au—Sn. Alternatively, the support substrate 41 may also be formed on the barrier metal layer 35 using, for example, a plating technology. When the support substrate 41 is a conductive substrate, the support substrate 41 may serve as a p-electrode pad. Alternatively, when the support substrate 41 is an insulating substrate, the p-electrode pad 53 may be formed on the barrier metal layer 35 positioned on the support substrate 41.

Meanwhile, an upper surface of the semiconductor stack 30, that is, a surface of the n-type compound semiconductor layer 25 may have a roughened surface R and a flat surface. As shown in FIGS. 2A to 2C, the n-electrode pad 51 and the electrode extension 51a are positioned on a flat surface. As shown, the n-electrode pad 51 and the electrode extension 51a may be restrictively positioned on the flat surface and have a width narrower than that of the flat surface. Therefore, a phenomenon that the electrode pad or the electrode extension is peeled off due to undercut, or the like, generated in the semiconductor stack 30 is prevented, such that reliability may be increased. Meanwhile, the roughened surface R may be positioned at a position slightly lower than that of the flat surface. That is, the roughened surface R may be positioned at a position lower than those of the electrode pad 51 and the electrode extension 51a.

Meanwhile, the n-electrode pad 51 is positioned on the semiconductor stack 30 and has the electrode extension 51a extending therefrom. A plurality of n-electrode pads 51 may be positioned on the semiconductor stack 30 and have electrode extensions 51a each extending therefrom. The electrode extensions 51a may be electrically connected to the semiconductor stack 30 and directly contact the n-type compound semiconductor layer 25, that is, the n-type contact layer 25a.

The n-electrode pad 51 may also be positioned over the groove region of the reflective metal layer 31. That is, the reflective metal layer 31 ohmic-contacting the p-type compound semiconductor layer 29 is not present under the n-electrode pad 51. Instead, the intermediate insulating layer 33 is positioned under the n-electrode pad 51. Furthermore, the electrode extension 51a is also positioned over the groove region of the reflective metal layer 31. As shown in FIG. 1, the electrode extensions 51a may be positioned over those regions between the plurality of plates in the reflective metal layer 31 formed of the plurality of plates. The groove region of the reflective metal layer 31, for example, the region between the plurality of plates may have a width wider than that of the electrode extension 51a. Therefore, a phenomenon that the current concentratedly flows beneath the electrode extension 51a may be prevented.

Meanwhile, the upper insulating layer 47 is interposed between the n-electrode pad 51 and the semiconductor stack 30. A phenomenon that the current flows from the n-electrode pad 51 directly to the semiconductor stack 30 may be prevented by the upper insulating layer 47. Particularly, a phenomenon that the current is concentrated beneath the n-electrode pad 51 may be prevented. In addition, the upper insulating layer 47 covers the roughened surface R. Here, the upper insulating layer 47 may have a concave-convex surface formed along the roughened surface R. The concave-convex surface of the upper insulating layer 47 may have a convex shape. The total internal reflection generated on an upper surface of the upper insulating layer 47 may be reduced by the concave-convex surface of the upper insulating layer 47.

The upper insulating layer 47 may cover the side of the semiconductor stack 30 to protect the semiconductor stack 30 from an external environment. Furthermore, the upper insulating layer 47 may have openings exposing the semiconductor stack 30, and the electrode extension 51a may be positioned in the openings to contact the semiconductor stack 30.

FIGS. 4 to 9 are cross-sectional views describing a method of manufacturing a light emitting diode according to an exemplary embodiment of the present invention. Wherein FIG. 4A is a schematic cross-sectional view showing a state after semiconductor layers are grown on a substrate 21; and FIG. 4B is a cross-sectional view of the semiconductor layers enlarged in order to describe the semiconductor layers. The cross-sectional views correspond to a cross-sectional view taken along the line A-A of FIG. 1.

Figure 4A:
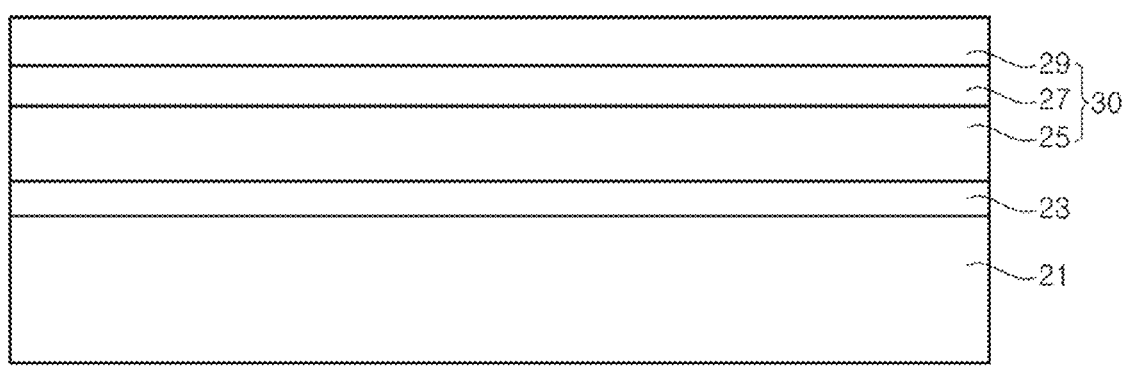
FIG. 4A is a cross-sectional view showing a state after semiconductor layers are grown on a substrate.
Figure 4B:
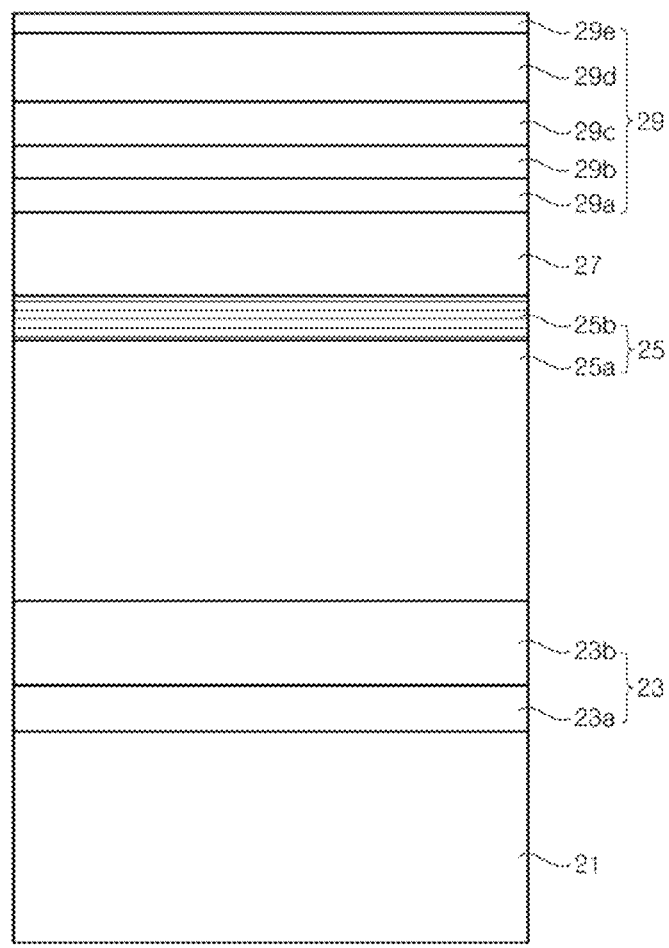
FIG. 4B is an enlarged cross-sectional view of the semiconductor layers.

Referring to FIGS. 4A and 4B, a buffer layer 23 is formed on a growth substrate 21, and a semiconductor stack 30 including an n-type semiconductor layer 25, an active layer 27, and a p-type semiconductor layer 29 is formed on the buffer layer 23. The growth substrate 21 may be a sapphire substrate but is not limited thereto. That is, the growth substrate may be other heterogeneous substrates, for example, a silicon substrate. Each of the n-type and p-type semiconductor layers 25 and 29 may be formed of multiple layers as shown in FIG. 4B. In addition, the active layer 27 may have a single quantum well structure or a multiple quantum well structure.

The buffer layer 23 may include a nucleation layer 23a and a high temperature buffer layer 23b. The nucleation layer 23a may be formed as a gallium nitride based material layer such as gallium nitride, aluminum nitride, or the like. In addition, the high temperature buffer layer 23b may be made of, for example, undoped GaN.

In addition, the n-type semiconductor layer 25 may include the n-type contact layer 25a and the superlattice layer as described with reference to FIG. 3. The n-type contact layer may be made of, for example, GaN, and the superlattice layer may be made of, for example, GaN/InGaN or InGaN/InGaN. Meanwhile, the p-type semiconductor layer 29 may include an electron blocking layer 29a, a hole injection layer 29b, an undoped layer or lowly doped layer 29c, a p-type contact layer 29d, and a highly doped layer 29e. The electron blocking layer 29a may be made of AlGaN, the hole injection layer 29b, the undoped layer or lowly doped layer 29c and the p-type contact layer 29d may be made of, for example, GaN, and the highly doped layer 29e may be made of InGaN. The highly doped layer 29e may also be doped with n-type impurities as well as p-type impurities at a high concentration to have a significantly thin thickness (less than 1 nm).

The compound semiconductor layers may be made of a III-N based compound semiconductor and be grown on the growth substrate 21 by a process such as a metal organic chemical vapor deposition (MOCVD) process, a molecular beam epitaxy (MBE) process, or the like.

Figure 5:
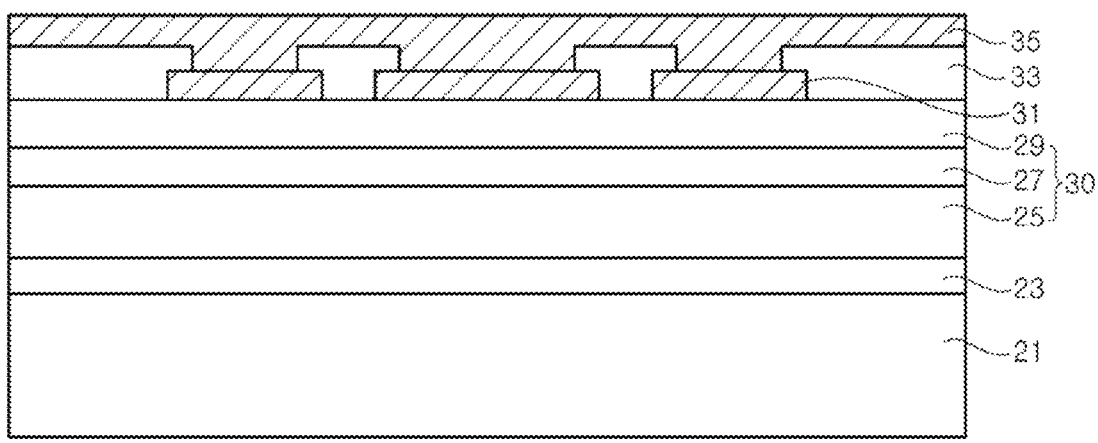

Referring to FIG. 5, a reflective metal layer 31 is formed on the semiconductor stack 30. The reflective metal layer 31 has a groove exposing the semiconductor stack 30. For example, the reflective metal layer 31 may be formed of a plurality of plates, wherein the plurality of plates include grooves formed therebetween (See FIG. 1).

Then, an intermediate insulating layer 33 covering the reflective metal layer 31 is formed. The intermediate insulating layer 33 may fill the groove in the reflective metal layer and cover a side and an edge of the reflective metal layer. In addition, the intermediate insulating layer 33 may have openings exposing the reflective metal layer 31. The intermediate insulating layer 33 may be formed of a silicon oxide film or a silicon nitride film and be a distributed Bragg reflector in which insulating layers having different reflective indices are repeatedly stacked.

A barrier metal layer 35 is formed on the intermediate insulating layer 33. The barrier metal layer 35 may fill the openings formed in the intermediate insulating layer 33 and be connected to the reflective metal layer 31.

Figure 6:
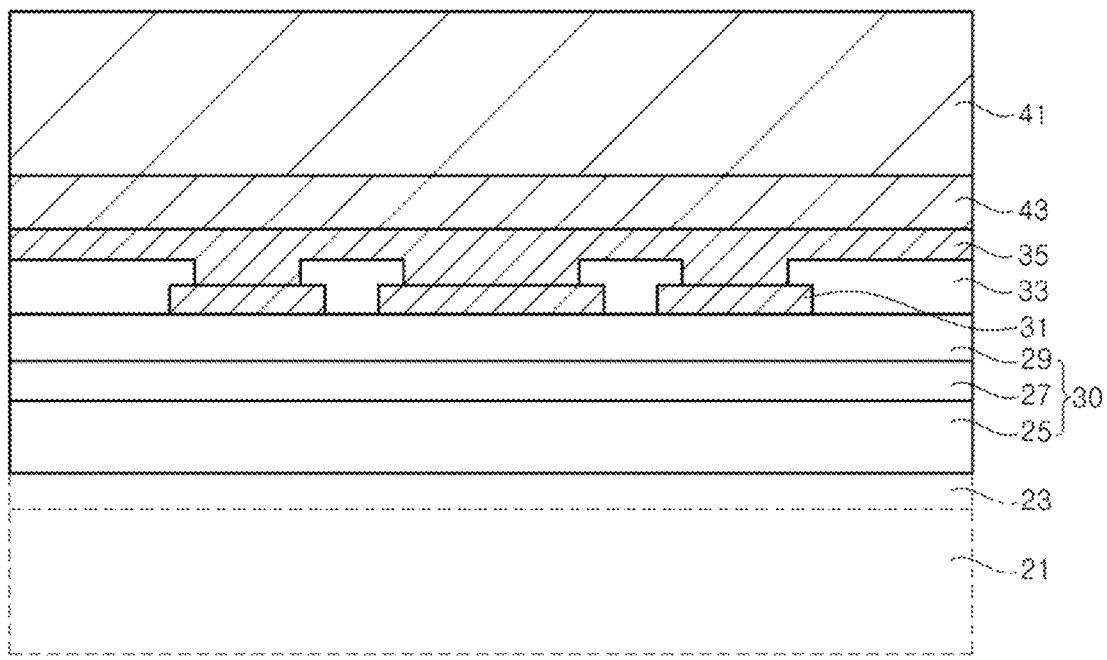

Referring to FIG. 6, a support substrate 41 is attached onto the barrier metal layer 35. The support substrate 41 may be separately manufactured from the semiconductor stack 30 and then bonded to the barrier metal layer 35 through a bonding metal 43. Alternatively, the support substrate 41 may be formed by being plated on the barrier metal layer 35.

Then, the growth substrate 21 is removed. The growth substrate 21 may be removed using a laser lift-off (LLO) technology. After the growth substrate 21 is removed, the buffer layer 23 is also removed, such that a surface of the n-type semiconductor layer 25 of the semiconductor stack 30 is exposed.

Figure 7:
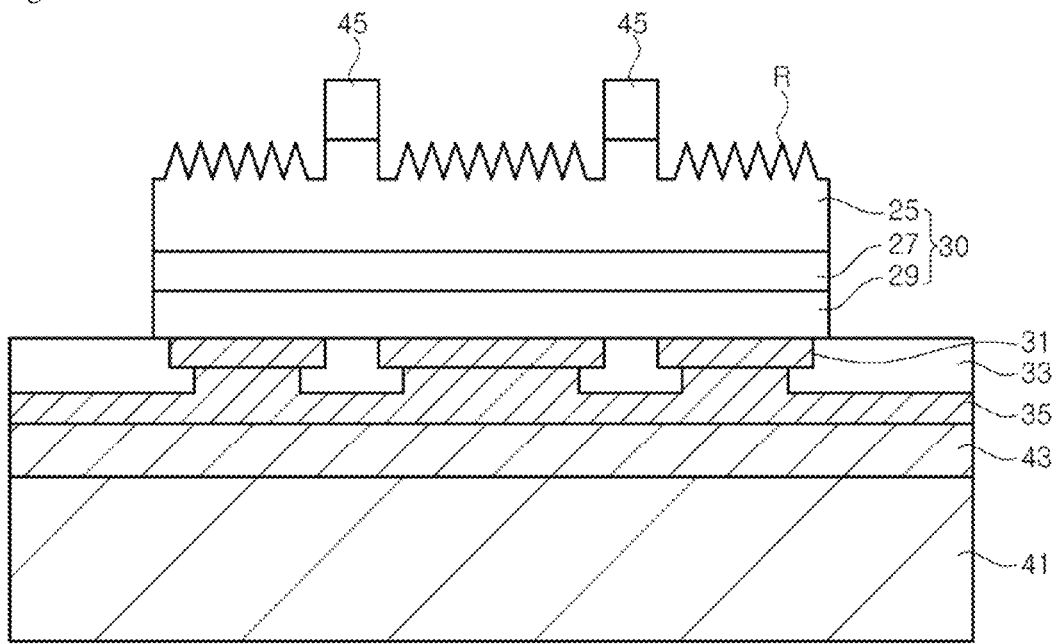

Referring to FIG. 7, a mask pattern 45 is formed on the exposed n-type semiconductor layer 25. The mask pattern 45 covers a region of the n-type semiconductor layer 25 corresponding to the groove of the reflective metal layer 31 and exposes a region other than the above-mentioned region. Particularly, the mask pattern 45 covers a region in which an n-electrode pad and an electrode extension will be formed in a subsequent process. The mask pattern 45 may be made of a polymer such as a photoresist.

Then, a roughened surface R is formed on the n-type semiconductor layer 25 by anisotropically etching the surface of the n-type semiconductor layer 25 using the mask as an etching mask. Then, the mask 45 is removed. A surface of the n-type semiconductor layer 25 at which the mask 45 is positioned is maintained as a flat surface.

Meanwhile, the semiconductor stack 30 is patterned, such that a chip division region is formed and the intermediate insulating layer 33 is exposed. The chip division region may be formed before or after the roughened surface R is formed.

Figure 8:
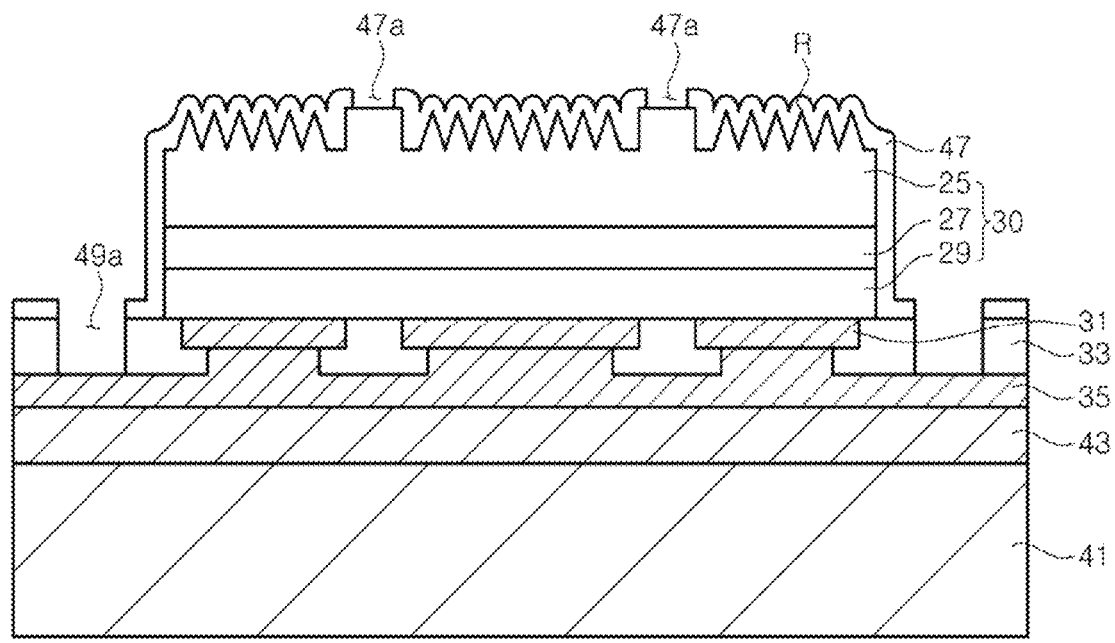

Referring to FIG. 8, an upper insulating layer 47 is formed on the n-type semiconductor layer 25 on which the roughened surface R is formed. The upper insulating layer 47 is formed along the roughened surface R, such that it has a concave-convex surface corresponding to the roughened surface R. The upper insulating layer 47 covers the flat surface in which an n-electrode pad 51 is to be formed. The upper insulating layer 47 may also cover a side of the semiconductor stack 30 exposed in the chip division region. The upper insulating layer 47 has openings 47a exposing the flat surface of a region in which an electrode extension 51a is to be formed. In addition, openings 49a may be formed in the upper insulating layer 47 and the intermediate insulating layer 33, and the barrier metal layer 35 may be exposed through the openings 49a. When the support substrate 41 is a conductive substrate, a process of forming the opening 49a may be omitted.

Then, the n-electrode pad 51 is formed on the upper insulating layer 47, the electrode extension is formed in the opening 47a, and a p-electrode pad 53 is formed in the opening 49a. The electrode extension extends from the n-electrode pad 51 and is electrically connected to the semiconductor stack 30.

Then, division into individual chips along the chip division region is performed, such that a light emitting diode is completed (See FIG. 2A).

Figure 9:
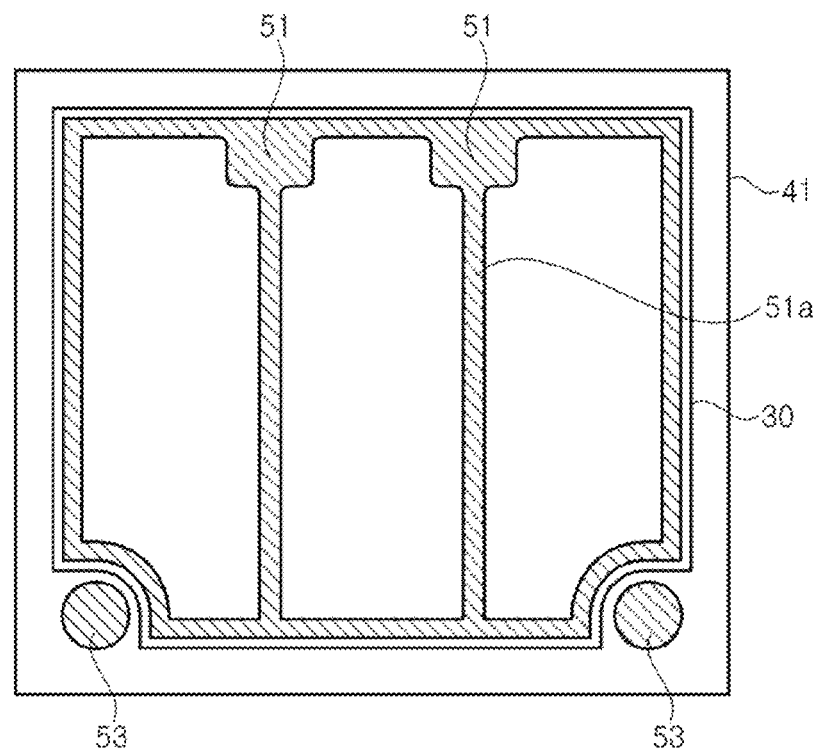
FIG. 9 is a schematic layout diagram describing a light emitting diode according to another exemplary embodiment of the present invention.
Figure 10:
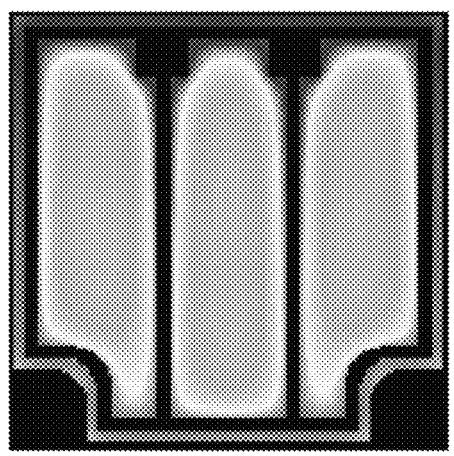
FIGS. 10A to 10D are views showing simulation results of a light emitting pattern according to a doping concentration in an n-type contact layer.
Figure 10:
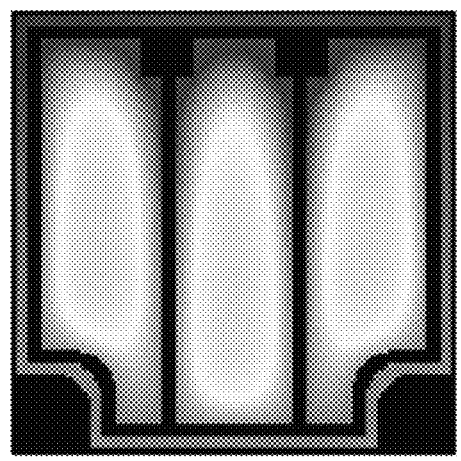
Figure 10:
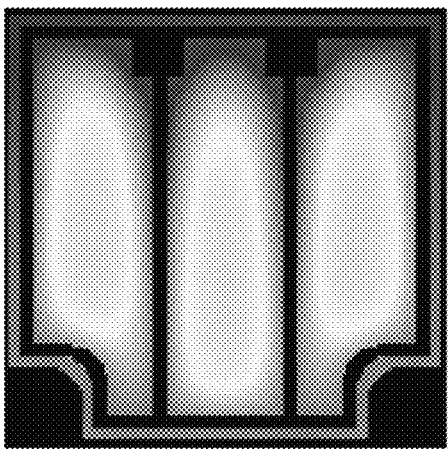
Figure 10:
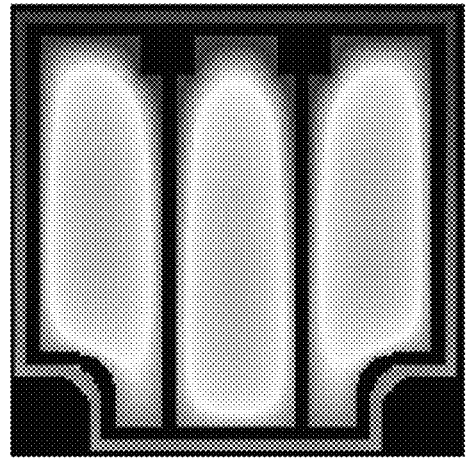

FIG. 9 is a schematic layout diagram describing a light emitting diode according to another exemplary embodiment of the present invention.

Referring to FIG. 9, the light emitting diode according to the present embodiment is similar to the light emitting diode described with reference to FIGS. 1 to 3 but is different therefrom in that the electrode extension 51a is further disposed along an edge on the semiconductor stack 30. Therefore, the electrode extension 51a of FIG. 1 are electrically connected to each other.

The reflective metal layer 31 ohmic-contacting the p-type semiconductor layer 29 is not present under the electrode extension 51a in a vertical direction. Instead, the intermediate insulating layer 33 is positioned on the surface of the p-type semiconductor layer 29.

According to the present embodiment, the electrode extension is added to the edge region of the semiconductor stack 30, thereby making it possible to further improve current spreading performance.

Experimental Example 1

In order to inspect current spreading performance according to a doping concentration, simulation was performed while changing a doping concentration in an n-type contact layer 25a in the same structure. As a light emitting diode, a vertical type light emitting diode having a size of 1240 um×1240 um was used. This light emitting diode had a structure generally similar to that of the light emitting diode of FIG. 1; however, it had mesh-shaped electrode extensions 51a as shown in FIG. 9 and a plurality of n- and p-electrode pads 51 and 53.

Here, each of the electrode extensions 51a was made of Ti/Al/Ti/Au and had a width of 10 um and a thickness of 1025 nm, and n-contact resistance was calculated as 50 Ω/sq. Meanwhile, an n contact layer 25a had a thickness of 3 um and resistivity extracted in consideration of concentration and mobility of carriers. Meanwhile, a superlattice layer 25b has a structure in which twenty pairs of 2 nm InGaN and 2 nm GaN are stacked, and only a GaN layer was doped with Si at a concentration of $1.1 \times 10^{19}$/cm$^3$, such that it has resistivity of 0.725 Ωcm. Meanwhile, an active layer 27 had a multiple quantum well structure and a thickness of 60 nm, a p-AlGaN 29a had a thickness of 20 nm and resistivity of 3.6 Ωcm, a p-GaN hole injection layer 29b had a thickness of 20 nm and a carrier concentration of $8.6 \times 10^{17}$/cm$^3$, an undoped layer 29c has a thickness of 45 nm and a resistivity of 0.725 Ωcm, a p-type contact layer 29d had a thickness of 65 nm and a carrier concentration of $1.6 \times 10^{18}$/cm$^3$, and p contact resistance was calculated as 1632 Ω/sq. The simulation was performed under driving current of 350 mA.

FIGS. 10A to 10D are views showing simulation results of a light emitting pattern according to a Si doping concentration. Wherein FIGS. 10A, 10B, 10C, and 10D show, respectively, a light emitting pattern in the case in which each of Si doping concentrations in the n-type contact layer 25a is $1 \times 10^{18}$/cm$^3$, $5 \times 10^{18}$/cm$^3$, $6 \times 10^{18}$/cm$^3$, and $1 \times 10^{19}$/cm$^3$.

Referring to FIGS. 10A to 10D, it could be appreciated that as the doping concentration increases from $1 \times 10^{18}$/cm$^3$ to $5 \times 10^{18}$/cm$^3$, a light emitting region increases. Meanwhile, in the doping concentrations of $5 \times 10^{18}$/cm$^3$ and $6 \times 10^{18}$/cm$^3$, the light emitting patterns were almost similar to each other. Meanwhile, in the case in which the doping concentration increases to $1 \times 10^{19}$/cm$^3$, the light emitting pattern was similar to that of the case in which the doping concentration is $1 \times 10^{18}$/cm$^3$.

Meanwhile, a light output, forward voltage, and a standard deviation of current density in an active layer according to a doping concentration were summed up in Table 1.

TABLE 1

| | Si Doping Concentration in n-type Contact Layer ($\times 10^{18}$/cm$^3$) | | | |
|---|---|---|---|---|
| | 1.0 | 5 | 6 | 10 |
| Entire Light Output | 266.6 | 274.6 | 274.9 | 272.0 |
| Forward Voltage | 3.06 | 3.01 | 3.01 | 3.03 |
| Standard Deviation | 8.5 | 6.5 | 6.4 | 7.0 |

Referring to Table 1, it was observed that as the Si doping concentration increases, the entire light output increases, the forward voltage decreases, the standard deviation of current density in the active layer decreases. However, when the doping concentration increases to $1 \times 10^{19}$/cm$^3$, the entire light output again has decreased, the forward voltage has increased, and the standard deviation has increased.

According to the above simulation results, in the case in which the doping concentration in the n-type contact layer 25a is $6 \times 10^{18}$/cm$^3$, all of the light emitting pattern, the light output, the forward voltage, and the standard deviation were excellent, and even in the case in which the doping concentration in the n-type contact layer 25a is $5 \times 10^{18}$/cm$^3$, the light emitting pattern, the light output, the forward voltage, and the standard deviation were similar to those in the case in which the doping concentration in the n-type contact layer 25a is $6 \times 10^{18}$/cm$^3$. Therefore, it is expected that good results may be obtained in the case in which the doping concentration in the n-type contact layer is in the range of $5 \times 10^{18}$/cm$^3$ to $7 \times 10^{18}$/cm$^3$. However, as shown in photographs of FIGS. 10A to 10D, there is a limitation in achieving good current spreading only through the control of the doping concentration described above.

Experimental Example 2

In order to inspect current spreading performance according to a thickness of an n-type contact layer, simulation was performed while changing a thickness of an n-type contact layer 25a in the same structure. A doping concentration of the n-type contact layer 25a was $5 \times 10^{18}$/cm$^3$, all of the other conditions were the same as those of Experimental Example 1, and only a thickness of the n-type contact layer 25a was changed.

FIGS. 11A to 11C are views showing simulation results of a light emitting pattern according to a thickness of the n-type contact layer. Wherein FIGS. 11A, 11B, and 11C show, respectively, a light emitting pattern in the case in which each thickness of the n-type contact layer 25a is 3 um, 5 um, and 10 um.

Figure 11:
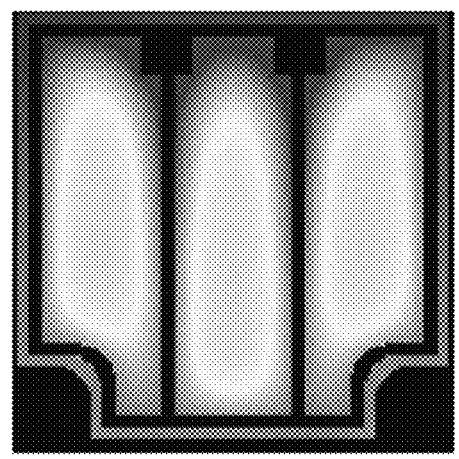
FIGS. 11A to 11C are views showing simulation results of a light emitting pattern according to a thickness of the n-type contact layer.
Figure 11:
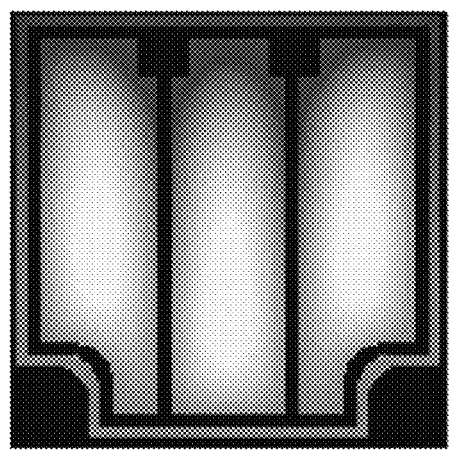
Figure 11:
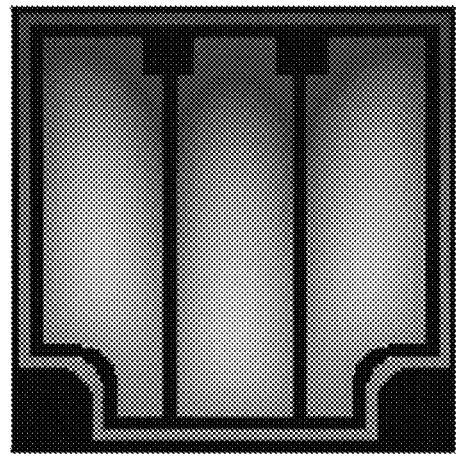

Referring to FIG. 11, it could be appreciated that a light emitting region increases in the case in which the thickness of the n-type contact layer 25a is 5 um and the case in which the thickness of the n-type contact layer 25a is 10 um as compared to the case in which the thickness of the n-type contact layer 25a is 3 um. Particularly, it could be appreciated that light is uniformly emitted over almost the entire region in the case in which the thickness of the n-type contact layer 25a is 10 um.

Meanwhile, a light output, forward voltage, and a standard deviation of current density in an active layer according to a thickness of an n-type contact layer were summed up in Table 2.

TABLE 2

| | Thickness of n-type Contact Layer | | |
|---|---|---|---|
| | 3 um | 5 um | 10 um |
| Entire Light Output | 274.6 | 276.4 | 277.8 |
| Forward Voltage | 3.01 | 3.00 | 2.99 |
| Standard Deviation | 6.5 | 6.3 | 6.2 |

Referring to Table 2, it was observed that as the thickness of the n-type contact layer increases, the entire light output increase, the forward voltage decreases, and the standard deviation of current density in the active layer decreases.

Therefore, the n-type contact layer 25a is relatively thickened to a thickness of 5 um or more, thereby making it possible to increase the light emitting region, increase the light output, and decrease and the forward voltage and the standard deviation of current density in the active layer.

Figure 12:
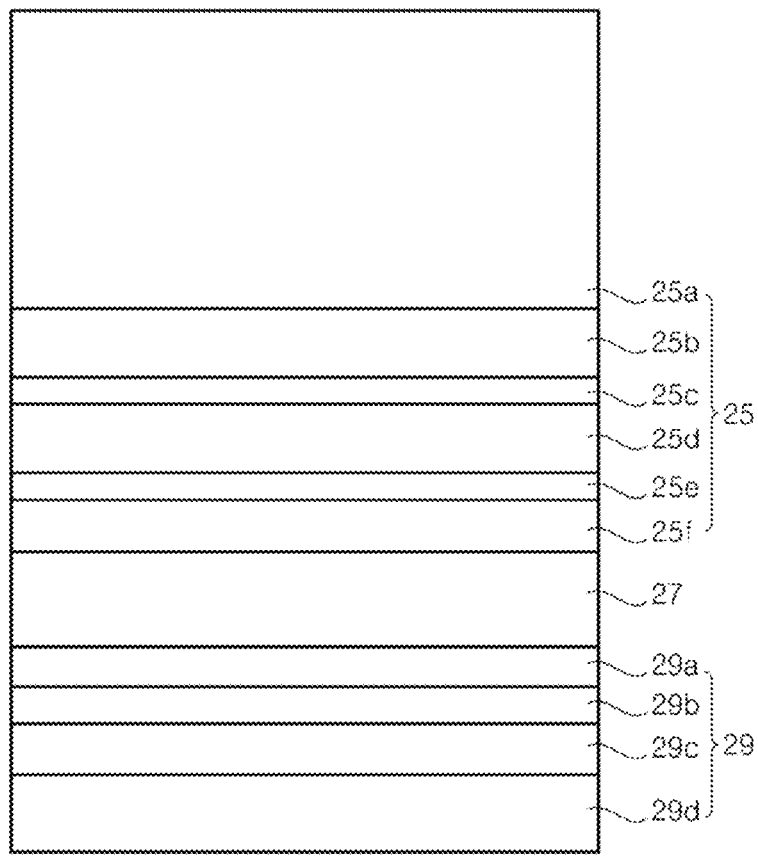
FIG. 12 is an enlarged cross-sectional view describing a semiconductor stack of the light emitting diode according to still another exemplary embodiment of the present invention.

FIG. 12 is a schematic enlarged cross-sectional view describing a light emitting diode according to still another exemplary embodiment of the present invention. Similar to the light emitting diode described with reference to FIGS. 1 to 3, the light emitting diode according to the present embodiment may be configured to include a support substrate 41, a semiconductor stack 30, a reflective metal layer 31, an intermediate insulating layer 33, a barrier metal layer 35, an upper insulating layer 47, an n-electrode pad 51, a p-electrode pad 53, an electrode extension 51a, and a bonding metal 43. Here, a detailed description of the same components as those of the light emitting diode described above will be omitted to avoid an overlapped description.

Referring to FIG. 12, each of an n-type compound semiconductor layer 25 and a p-type compound semiconductor layer 29 may be formed of multiple layers as shown in FIG. 12. That is, the n-type compound semiconductor layer 25 may include an n-type contact layer 25a, a first recovering layer 25b, an electron supplementation layer 25c, a second recovering layer 25d, an electron injection layer 25e, and a superlattice layer 25f. The n-type contact layer 25a, which is an n-type semiconductor layer to which current is injected from the outside, may have a high doping concentration, for example, a doping concentration of 4 to 9E18/cm³. The n-type contact layer 25a may have a roughened surface, and the entire thickness of the n-type contact layer 25a including the roughened surface may be in the range of 4.5 to 10 um. When the n-type contact layer 25a has a thin thickness, reliability is deteriorated due to current crowding. In addition, when the n-type contact layer 25a has a thickness of 10 um or more, crystallinity of the n-type contact layer is deteriorated and forward voltage of the light emitting diode is increased.

Meanwhile, the first recovering layer 25b may contact the n-type contact layer 25a and be a relatively lowly doped layer or an undoped layer as compared to the n-type contact layer 25a. The first recovering layer 25b impedes electrons from progressing in a vertical direction to help current spreading in the n-type contact layer 25a. The first recovering layer 25b may have a thickness thicker than a thickness at which electrons may be tunneled. However, when the first recovering layer 25b has an excessive thick thickness, forward voltage may increase. Therefore, the first recovering layer 25b may have a thickness of 100 to 200 nm.

Meanwhile, the electron supplementation layer 25c supplements electrons between the first and second recovering layers 25b and 25d that have relatively high resistivity to alleviate an increase in forward voltage of the light emitting diode. The electrode supplementation layer 25c may be doped at a relatively higher concentration as compared to the first recovering layer 25b and have a relatively thinner thickness, for example, a thickness of 10 to 20 nm, as compared to the first recovering layer 25b.

The second recovering layer 25d may be a low concentration doped layer or an undoped layer, similar to the first recovering layer 25b, and have a thickness of 100 to 200 nm. The second recovering layer 25d is formed in addition to the first recovering layer 25b, in order to improve crystallinity of an active layer 27. Therefore, the second recovering layer 25d may be omitted as needed.

Meanwhile, the electron injection layer 25e, which is a layer for injecting electrons into the active layer 27, is formed as a highly doped layer, similar to the n-type contact layer 25a. The electron injection layer 25e may be formed to have a thickness of, for example, a 10 to 30 nm.

The superlattice layer 25f may be formed in order to alleviate strain caused by a relatively thick n-type contact layer 25a. The superlattice layer 25f may be formed by alternately stacking (In)GaN layers having different compositions.

Meanwhile, the p-type compound semiconductor layer 29 may include an electron blocking layer 29a, a hole injection layer 29b, an undoped layer or lowly doped layer 29c, and a p-type contact layer 29d. The p-type contact layer 29d is a semiconductor layer into which the current is injected from the outside and ohmic-contacts the reflective metal layer 31. Meanwhile, when it is difficult to allow the reflective metal layer 31 directly to ohmic-contact the p-type contact layer 29d, a highly doped layer (not shown) may be added in order to ohmic-contact therebetween.

Figure 13A:
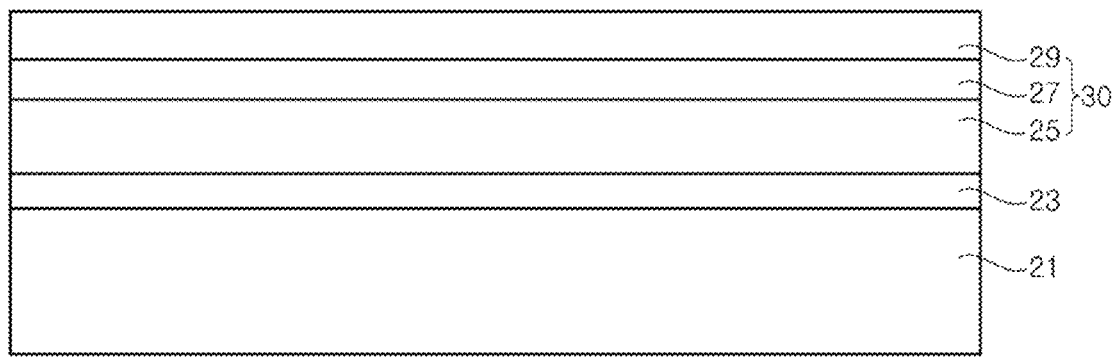
FIGS. 13A and 13B are, respectively, a cross-sectional view showing a state after semiconductor layers are grown in a substrate and an enlarged cross-sectional view of the semiconductor layers.
Figure 13B:
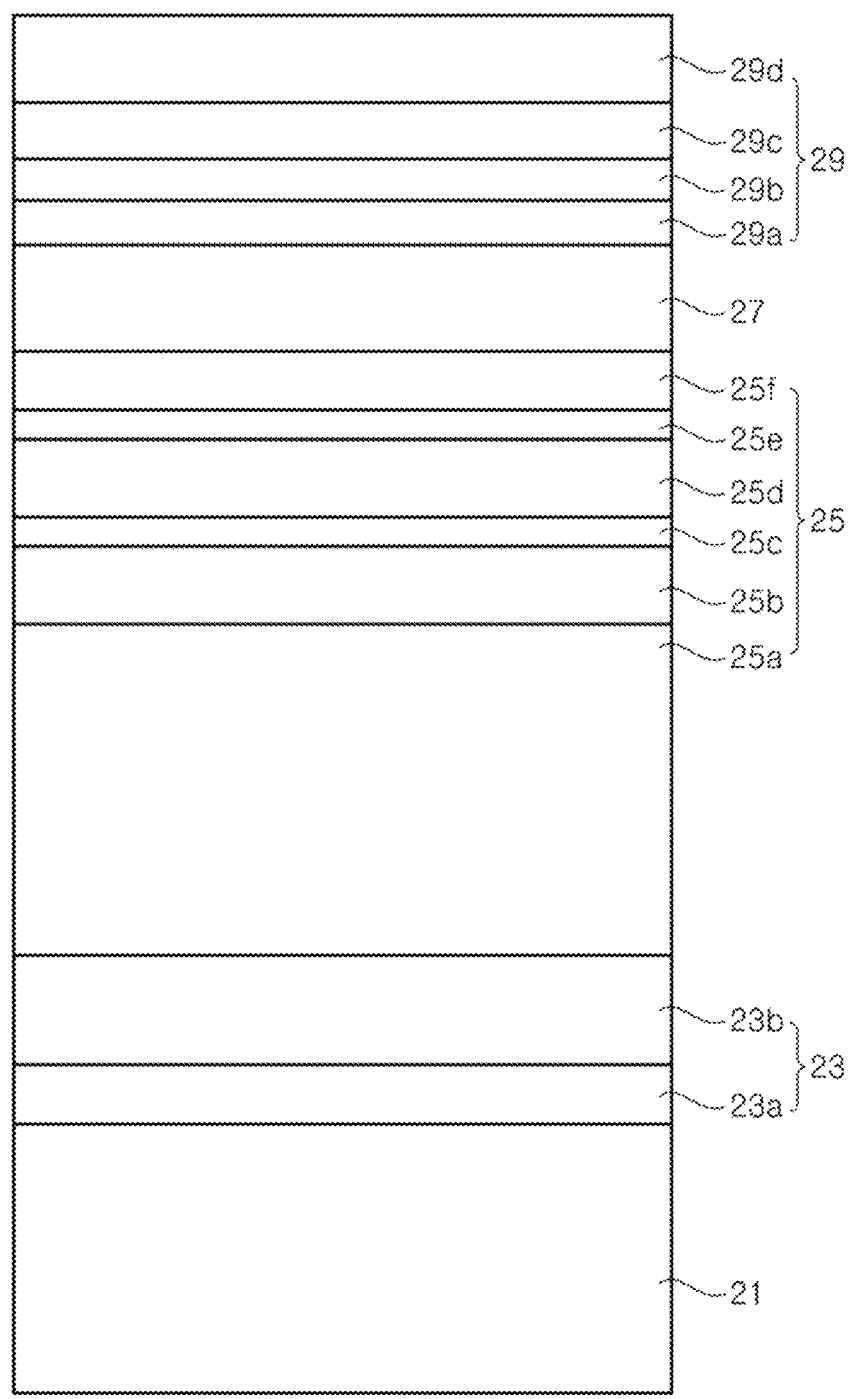

FIGS. 13A and 13B are, respectively, cross-sectional views describing a method of manufacturing a light emitting diode according to an exemplary embodiment of the present invention, wherein FIG. 13A is a cross-sectional view showing a state after semiconductor layers are grown in a substrate 21 and FIG. 13B is a cross-sectional view of the semiconductor layers enlarged in order to describe the semiconductor layers. The cross-sectional views correspond to a cross-sectional view taken along the line A-A of FIG. 1.

Referring to FIGS. 13A and 13B, a buffer layer 23 is formed on a growth substrate 21, and a semiconductor stack 30 including an n-type semiconductor layer 25, an active layer 27, and a p-type semiconductor layer 29 is formed on the buffer layer 23, as described with reference to FIGS. 4A and 4B. Each of the n-type and p-type semiconductor layers 25 and 29 may be formed of multiple layers as shown in FIG. 13B.

The n-type semiconductor layer 25 may include a n-type contact layer 25a, a first recovering layer 25b, an electron supplementation layer 25c, a second recovering layer 25d, an electron injection layer 25e, and a superlattice layer 25f, as described with reference to FIG. 12. The n-type contact layer, the first recovering layer, the electron supplementation layer, the second recovering layer, and the electron injection layer may be made of, for example, GaN, and the superlattice layer may be made of, for example, GaN/InGaN or InGaN/InGaN. Meanwhile, the p-type semiconductor layer 29 may include an electron blocking layer 29a, a hole injection layer 29b, an undoped layer or lowly doped layer 29c, and a p-type contact layer 29d. The first recovering layer 25b is formed in order to recover crystallinity deteriorated by relatively thickening the n-type contact layer 25a doped at a high concentration.

Then, a light emitting diode is completed through a process as described with reference to FIGS. 5 to 8 (See FIG. 2A).

The semiconductor stack 30 of the light emitting diode according to the present embodiment may also be applied to the light emitting diode described with respect to FIG. 9.

Figure 14:
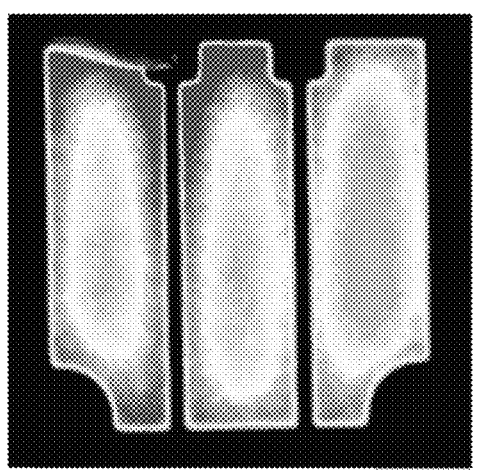
FIGS. 14A and 14B are photographs showing a light emitting pattern according to a thickness of an n-type semiconductor layer.
Figure 14:
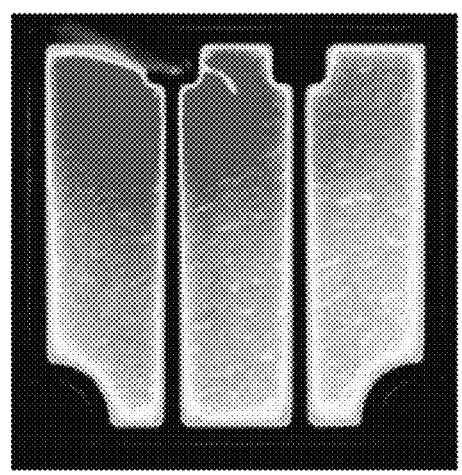

FIGS. 14A and 14B are photographs showing a light emitting pattern according to a thickness of an n-type contact layer 25a. Wherein FIG. 14A shows a light emitting pattern in the case in which an n-type contact layer 25a has a thickness of 3.5 um (Comparative Example); and FIG. 14B shows a light emitting pattern in the case in which an n-type contact layer 25a has a thickness of 5 um (Inventive Example). Meanwhile, light emitting diodes having a size of 1200 um×1200 um were manufactured in a state in which all of the other conditions are the same, and electrode extensions 51a as shown in FIG. 9 were formed.

In the case of FIG. 14A, it could be appreciated that light is mainly emitted in the vicinity of the electrode extensions and a light output is relatively low in a central region enclosed by the electrode extensions. On the other hand, in the case in FIG. 14B, it could be appreciated that a large difference is not generated in view of a light output between a central region enclosed by electrode extensions and a region that is in the vicinity of the electrode extensions.

Meanwhile, reliability of a light output according to a time in which accelerating current of 700 mA is applied was tested with respect to the above-mentioned light emitting diodes. Results of the test were summed up in Table 3. The light output was measured under the current of 350 mA, and a decrease in the light output was expressed as a percentage based on a light output before the accelerating current is measured. Under the measurement condition of 350 mA, there is no a difference in light output before the accelerating current is measured between Comparative Example and Inventive Example.

TABLE 3

| Sample | Accelerating Current | Measurement Current | Time 24 Hr | 250 Hr | 500 Hr | 750 Hr | 1000 Hr |
|---|---|---|---|---|---|---|---|
| Comparative Example | 700 mA | 350 mA | −7.5% | −12.5% | −12.2% | −12.7% | −13.6% |
| Inventive Example | 700 mA | 350 mA | −3.7% | −6.5% | −6.0% | −6.0% | −6.9% |

Referring to Table 3, in both of Comparative Example and Inventive Example, the light output tends to decrease as the accelerating current is applied. However, it could be appreciated that a decrease in the light output is significantly slowly made in the light emitting diode according to Inventive Example as compared to the light emitting diode according to Comparative Example and a decrease in the light output is about two times larger in the light emitting diode according to Comparative Example than the light emitting diode according to Inventive Example after the same time elapses.

It could be appreciated from the above result that the reliability of the light emitting diode is improved by increasing the thickness of the n-type contact layer, which is expected to be due to improvement in current spreading performance.

The invention claimed is:

1. A light emitting diode comprising:
a substrate;
a semiconductor stack disposed on the substrate, the semiconductor stack comprising a p-type compound semiconductor layer, an active layer, and an n-type compound semiconductor layer;
a reflective metal layer disposed between the substrate and the semiconductor stack and in ohmic contact with the p-type compound semiconductor layer, the reflective metal layer comprising a groove exposing a portion of the semiconductor stack;
a first electrode pad disposed on the n-type compound semiconductor layer;
an electrode extension extending from the first electrode pad and disposed over the groove; and
a first insulating layer disposed between a side surface of the first electrode pad and a side surface of the semiconductor stack,
wherein the n-type compound semiconductor layer comprises an n-type contact layer, and
wherein the n-type contact layer has an Si doping concentration of 5 to $7 \times 10^{18}/cm^3$ and a thickness in the range of 5 to 10 μm.

2. The light emitting diode of claim 1, wherein the n-type compound semiconductor layer further comprises a superlattice layer disposed between the n-type contact layer and the active layer.

3. The light emitting diode of claim 2, wherein the superlattice layer comprises alternately stacked InGaN layers and GaN layers.

4. The light emitting diode of claim 3, wherein the superlattice layer has a higher resistivity than that of the n-type contact layer.

5. The light emitting diode of claim 1, further comprising a second insulating layer disposed in the groove and contacting the portion of the semiconductor stack exposed by the groove.

6. The light emitting diode of claim 5, further comprising a barrier metal layer disposed between the reflective metal layer and the substrate.

7. The light emitting diode of claim 6, wherein the reflective metal layer comprises plates separated by the groove.

8. The light emitting diode of claim 1, wherein a first portion of the semiconductor plates stack comprises a roughened surface, and
wherein the first insulating layer covers the roughened surface and comprises a concave-convex surface corresponding to the roughened surface.

9. The light emitting diode of claim 8, wherein a second portion of the semiconductor stack comprises a flat surface, and the first electrode pad and the electrode extension are disposed on the flat surface.

10. The light emitting diode of claim 9, wherein the electrode extension contacts the flat surface of the semiconductor stack.

11. A light emitting diode, comprising:
a substrate;
a semiconductor stack disposed on the substrate, the semiconductor stack comprising a p-type compound semiconductor layer, an active layer, and an n-type compound semiconductor layer;
a reflective metal layer disposed between the substrate and the semiconductor stack and in ohmic contact with the p-type compound semiconductor layer, the reflective metal layer and comprising a groove exposing a portion of the semiconductor stack;
a first electrode pad disposed on the n-type compound semiconductor layer;
an electrode extension extending from the first electrode pad and disposed over the groove; and
a first insulating layer disposed between a side surface of the first electrode pad and a side surface the semiconductor stack,
wherein the n-type compound semiconductor layer comprises an n-type contact layer and a first recovering layer disposed between the n-type contact layer and the active layer,
wherein the first recovering layer comprises an undoped layer or a low doped layer comprising a doping concentration lower than that of the n-type contact layer, and
wherein the n-type contact layer has a thickness in the range of 4.5 to 10 μm.

12. The light emitting diode of claim 11, wherein the first recovering layer has a thickness in the range of 100 to 200 nm.

13. The light emitting diode of claim 12, further comprising an electron injection layer disposed between the first recovering layer and the active layer.

14. The light emitting diode of claim 13, further comprising
a second recovering layer disposed between the first recovering layer and an electron supplementation layer; and
an electron supplementation layer disposed between the first and second recovering layers.

15. The light emitting diode of claim 14, further comprising a superlattice layer disposed between the electron injection layer and the active layer.

16. The light emitting diode of claim 11, further comprising a second insulating layer disposed in the groove and contacting the portion of the semiconductor stack exposed by the groove.

17. The light emitting diode of claim 16, further comprising a barrier metal layer disposed between the reflective metal layer and the substrate.

18. The light emitting diode of claim 17, wherein the reflective metal layer comprises plates separated by the groove.

19. The light emitting diode of claim 11, wherein a first portion of the semiconductor stack comprises a roughened surface, and wherein the first insulating layer covers the roughened surface and comprises a concave-convex surface corresponding to the roughened surface.

20. The light emitting diode of claim 19, wherein a second portion of the semiconductor stack comprises a flat surface, and the first electrode pad and the electrode extension are disposed on the flat surface.

21. The light emitting diode of claim 20, wherein the electrode extension contacts the flat surface of the semiconductor stack.

* * * * *